(12) United States Patent
Reingruber et al.

(10) Patent No.: US 10,651,102 B2
(45) Date of Patent: May 12, 2020

(54) INTERPOSER WITH CONDUCTIVE ROUTING EXPOSED ON SIDEWALLS

(71) Applicant: Intel IP Corporation, Santa Clara, CA (US)

(72) Inventors: Klaus Reingruber, Langquaid (DE); Christian Geissler, Teugn (DE); Georg Seidemann, Landshut (DE); Sonja Koller, Regensburg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/778,410

(22) PCT Filed: Dec. 18, 2015

(86) PCT No.: PCT/US2015/066730
§ 371 (c)(1),
(2) Date: May 23, 2018

(87) PCT Pub. No.: WO2017/105498
PCT Pub. Date: Jun. 22, 2017

(65) Prior Publication Data
US 2018/0342431 A1 Nov. 29, 2018

(51) Int. Cl.
*H01L 23/48* (2006.01)
*H01L 23/13* (2006.01)
(Continued)

(52) U.S. Cl.
CPC .............. *H01L 23/13* (2013.01); *H01L 23/12* (2013.01); *H01L 23/49816* (2013.01);
(Continued)

(58) Field of Classification Search
CPC .............. H01L 23/13; H01L 23/49827; H01L 23/49816; H01L 23/12; H01L 23/49838;
(Continued)

(56) References Cited

U.S. PATENT DOCUMENTS

2003/0059976 A1* 3/2003 Nathan ............... H01L 23/5389
438/106
2004/0208210 A1* 10/2004 Inoguchi ............. H01L 25/0753
372/36
(Continued)

FOREIGN PATENT DOCUMENTS

| DE | 112015007196 | 8/2018 |
|---|---|---|
| TW | 201733035 A | 9/2017 |
| WO | WO-2017105498 A1 | 6/2017 |

OTHER PUBLICATIONS

"International Application Serial No. PCT/US2015/066730, International Search Report dated Aug. 31, 2016", 3 pgs.
(Continued)

*Primary Examiner* — Cuong B Nguyen
*Assistant Examiner* — Samuel Park
(74) *Attorney, Agent, or Firm* — Schwegman Lundberg & Woessner, P.A.

(57) ABSTRACT

An electronic assembly that includes an electronic component; and an interposer that includes a body having upper and lower surfaces and side walls extending between the upper and lower surfaces, the interposer further including conductive routings that are exposed on at least one of the side walls, wherein the electronic component is connected directly to the interposer. The conductive routings are exposed on each side wall and on the upper and lower surfaces. The electronic assembly may further includes a substrate having a cavity such that the interposer is within the cavity, wherein the cavity includes sidewalls and substrate includes conductive traces that are exposed from the sidewalls of the cavity, wherein the conductive traces that are exposed from the sidewalls of the cavity are electrically connected directly to the conductive routings that are exposed on at least one of the side walls of the interposer.

11 Claims, 9 Drawing Sheets

(51) Int. Cl.
*H01L 23/12* (2006.01)
*H01L 23/498* (2006.01)
*H05K 3/40* (2006.01)
*H05K 1/18* (2006.01)

(52) U.S. Cl.
CPC .. *H01L 23/49827* (2013.01); *H01L 23/49805* (2013.01); *H01L 23/49838* (2013.01); *H05K 1/183* (2013.01); *H05K 3/403* (2013.01); *H05K 2201/10378* (2013.01)

(58) Field of Classification Search
CPC .. H01L 23/49805; H05K 3/403; H05K 1/183; H05K 2201/10378
See application file for complete search history.

(56) References Cited

U.S. PATENT DOCUMENTS

| | | | |
|---|---|---|---|
| 2004/0248342 | A1 | 12/2004 | Anderson et al. |
| 2005/0275093 | A1* | 12/2005 | Noma ................ H01L 23/3114 257/734 |
| 2010/0078649 | A1* | 4/2010 | Moriyama ............ H01L 33/405 257/76 |
| 2010/0109164 | A1 | 5/2010 | Kang et al. |
| 2010/0176507 | A1* | 7/2010 | Shiv ........................ B81B 7/007 257/698 |
| 2011/0278741 | A1* | 11/2011 | Chua ..................... H01L 21/561 257/777 |
| 2013/0032390 | A1 | 2/2013 | Hu et al. |
| 2013/0221500 | A1 | 8/2013 | Zhao et al. |
| 2013/0329374 | A1* | 12/2013 | Lin ........................ H01L 23/10 361/728 |
| 2014/0016242 | A1 | 1/2014 | Hattori et al. |
| 2014/0284731 | A1* | 9/2014 | Nakao ............... H01L 23/49579 257/415 |
| 2016/0219712 | A1* | 7/2016 | Ko ........................ H05K 1/183 |

OTHER PUBLICATIONS

"International Application Serial No. PCT/US2015/066730, Written Opinion dated Aug. 31, 2016", 11 pgs.
"International Application Serial No. PCT US2015 066730, International Preliminary Report on Patentability dated Jun. 28, 2018", 13 pgs.

* cited by examiner

CUSHION THICKNESS

FREE WETTING CONTACT
PAD-TO-PAD

FORCED CONTACT DISTANCE

| SOLDER VOLUME [cm³] | WETTING OF PAD CUSHION THICKNESS [μm] | FREE WETTING CONTACT PAD-TO-PAD [μm] | FORCED CONTACT PAD-TO-PAD [μm] | MINIMUM PAD-TO-PAD [μm] |
|---|---|---|---|---|
| 1.00E-07 | 36.4 | 33.9 | 22.4 | 3.9 |
| 8.00E-08 | 30.7 | 28.9 | 18.0 | 3.1 |
| 6.00E-08 | 24.4 | 22.6 | 13.5 | 2.4 |
| 5.00E-08 | 20.9 | 19.3 | 11.2 | 2.0 |
| 4.00E-08 | 17.2 | 15.7 | 9.0 | 1.6 |
| 3.00E-08 | 13.3 | 12.0 | 6.7 | 1.2 |
| 2.00E-08 | 9.0 | 8.0 | 4.5 | 0.8 |
|  | FIG. 13 | FIG. 14 | FIG. 15 | FIG. 16 |

INTERPOSER WITH CONDUCTIVE ROUTING EXPOSED ON SIDEWALLS

CROSS-REFERENCE TO RELATED APPLICATION

This application is a U.S. National Stage Filing under 35 U.S.C. 371 from International Application No. PCT/US2015/066730, filed on Dec. 18, 2015, and published as WO 2017/105498, which application is incorporated herein by reference in its entirety.

BACKGROUND

There is a continuing desire to make integrated circuits increasingly smaller. One of the obstacles in developing smaller integrated circuits is due to the fact that the I/O pitch of printed circuit boards is typically far larger than the I/O pitch for electronic packages that are commonly mounted in the printed circuit boards.

This gap in I/O pitch between different electronic components is mainly addressed using fan-out approaches. As an example, a two-dimensional plane (e.g., a ball grid array) is commonly used for second level (i.e., electronic package to printed circuit board) interconnects. Therefore, conventional package architectures often have relatively larger footprints and higher cost to functionality ratios.

There is also a continuing need to reduce the z-height of electronic assemblies that include electronic packages mounted to printed circuit boards. Reducing the z-height of these types of electronic assemblies allows such electronic assemblies to be more readily incorporated into various small-scale electronic devices (e.g., mobile devices and/or wearables).

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the electrical interconnect or electronic package.

The electronic interposers described herein may use a bottom side and sidewalls to connect the interposer to a substrate (e.g., a printed circuit board). In some forms, the sidewalls of the interposer may be used for low power signals, especially when conductive routings that are exposed from the sidewalls of the interposer have a relatively small cross section.

Exposing conductive routings on the sidewall(s) of the interposer may provide an electronic assembly with locally higher I/O densities at areas where higher I/O densities are needed on the interposer. In addition, the interposer may serve as an adapter from one electronic device that has a wider I/O pitch (e.g., a printed circuit board) to another electronic device that has a tighter I/O pitch (e.g., a die).

Figure 1:
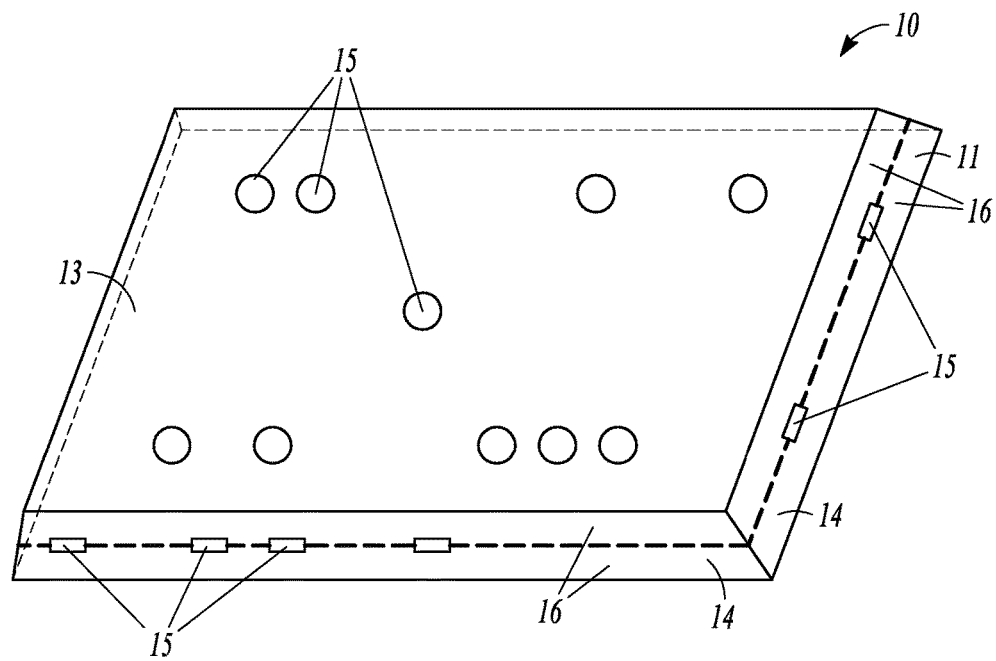
FIG. 1 is a perspective view of an example interposer from the bottom of the interposer.

FIG. 1 is a perspective view from the bottom of an example interposer 10. The interposer 10 includes a body 11 having an upper surface 12 (visible in FIG. 2) and a lower surface 13. The body further includes side walls 14 extending between the upper and lower surfaces 12, 13.

Conductive routings 15 are exposed on at least one of the side walls 14. It should be noted that the conductive routings 15 may be exposed on one, some or all of the side walls 15. The number, type and size of the conductive routings 15 that are exposed on the side walls 14 may vary depending on the type of interposer 10. In addition, different numbers of conductive routings 15 may be exposed on each of the side walls.

In the example interposer 10 shown in FIG. 1, the conductive routings are also exposed on the upper and lower surfaces 12, 13 of the interposer 10 (only lower surface 13 is visible in FIG. 1). It should be noted that the conductive routings 15 may be exposed on either the upper surface 12 or the lower surface 13 of the interposer 10. In some forms, the interposer 10 may include multiple nonconductive layers 16 such that the conductive routings 15 extend between the multiple nonconductive layers 16.

As an example, the nonconductive layers 16 may be dielectric layers. It should be noted that the nonconductive layers 16 may be any type of layer which is used in an interposer 10 that is known now, or discovered in the future.

Figure 2:
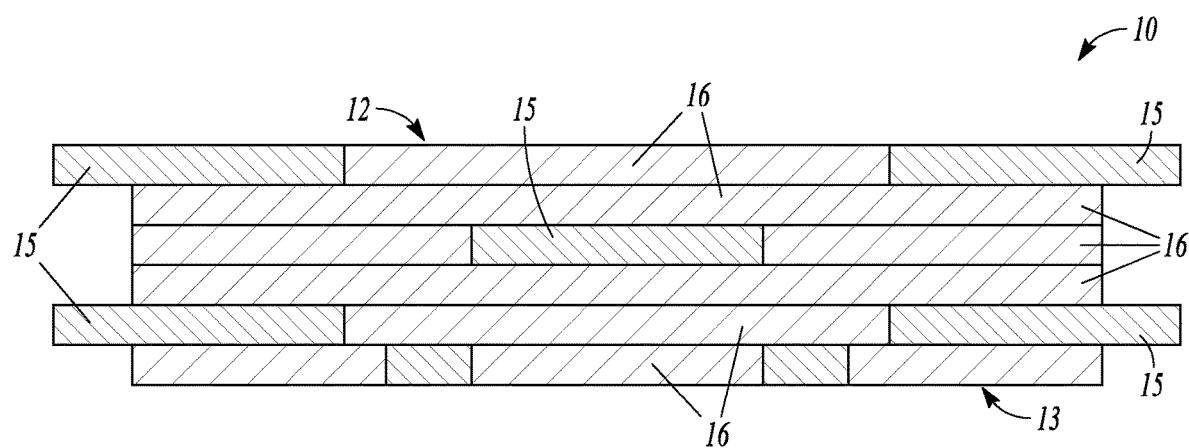
FIG. 2 is a schematic side section view of an interposer that includes multiple layers.

FIG. 2 is a schematic side section view of the interposer 10 where the interposer 10 includes more than two nonconductive layers 16 (e.g., dielectric layers). In the example interposer 10 that is shown in FIG. 2, the conductive routings 15 are exposed from the side walls 14 of the interposer 10 in different nonconductive layers 16.

In some forms, the conductive routings 15 may be laterally displaced relative to one another for conductive routings 15 that are in different nonconductive layers 16 in order to potentially prevent short circuiting between nearby conductive routings 15. The amount of lateral displacement that exists with nearby conductive routings 15 will depend in part on the manufacturing processes that are used to fabricate the interposer 10 as well as the size and shape of the conductive routings 15 (among other factors).

As shown in FIG. 2, the conductive routings 15 may be exposed from the side walls 14 in non-adjacent nonconductive layers 16. The conductive routings 15 may be exposed in non-adjacent nonconductive layers 16 to similarly serve to reduce the possibility of short circuiting between nearby conductive routings 15.

Referring again to FIG. 1, at least one of the side walls 14 may be at an angle other than 90 degrees relative to the upper surface 12 and the lower surface 13 of the body 11. It should be noted that one, some or all of the side walls 14 may be at an angle other than 90 degrees relative to the upper surface 12 and the lower surface 13 of the body 11.

One or more of the side walls 14 may be placed at an angle relative to the upper surface 12 and the lower surface 13 of the body 11 in order to facilitate exposing the conductive routings 15 during fabrication of the interposer 10. It should be noted that the side walls may be at any angle relative to the upper surface 12 and the lower surface 13 of the body 11. The angle that is selected for the side walls 14 will depend in part on the manufacturing processes that are used to fabricate the interposer 10 (among other factors).

In some forms, the interposer 10 may further include solder caps 17 (shown in later FIGS.) that are mounted on the conductive routings 15 which are exposed from the side walls 14 of the body 11. The size and type of solder caps 17 that are used in the interposer 10 will depend on the manufacturing processes that are used to place the solder caps 17 on the conductive routings 15 (among other factors).

As an example, the solder caps 17 may be formed by depositing a tin layer onto the conductive routings 15 (e.g., by dipping an interposer 10 and/or substrate 21 into a melted tin bath). Dipping an interposer 10 or substrate 21 into a tin bath may deposit tin that is about 40 to 50 micrometers thick onto the conductive routings 15 that are exposed from the side walls 14. As another example, the exposed conductive routings 15 may be covered with a conductive material (e.g., tin) by 3D printing in order to form the solder caps 17 on the conductive routings 15.

In some forms, the conductive routings 15 that are exposed on the upper and lower surfaces 12, 13 of the body 11 may be used for higher power signals than the conductive routings 15 that are exposed from the side walls 14 of the body 11. It should be noted that the conductive routings 15 that are exposed on the side walls 14 of the body 11 may be used for relatively lower power signals because the conductive routings 15 that are exposed from the side walls 14 may have a much smaller cross-section.

Figure 3:
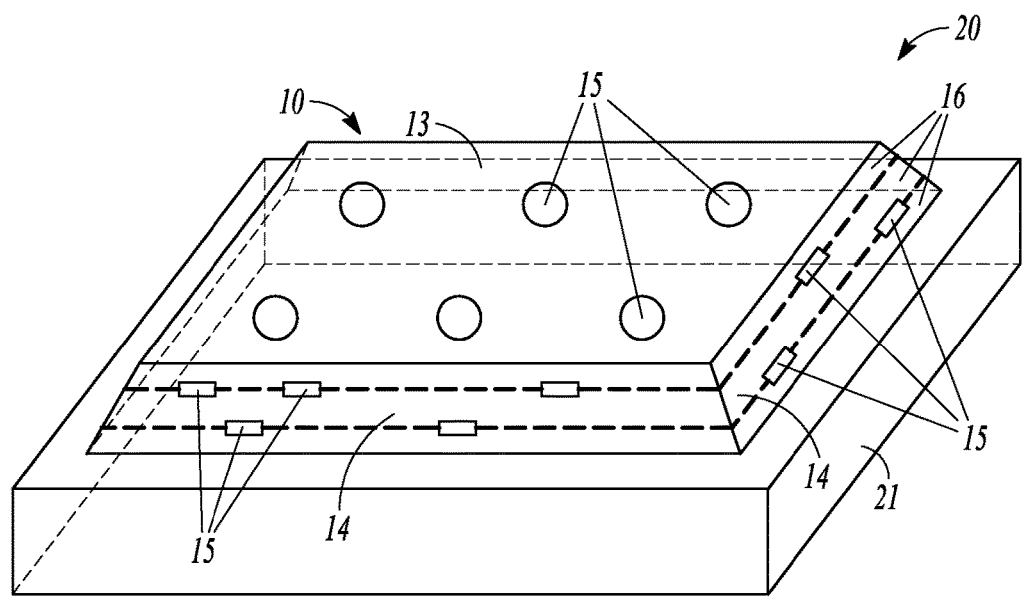
FIG. 3 is a perspective view of another example interposer from the bottom of the interposer when the interposer is mounted on a substrate (e.g., a printed circuit board) to form an electronic assembly.
Figure 4:
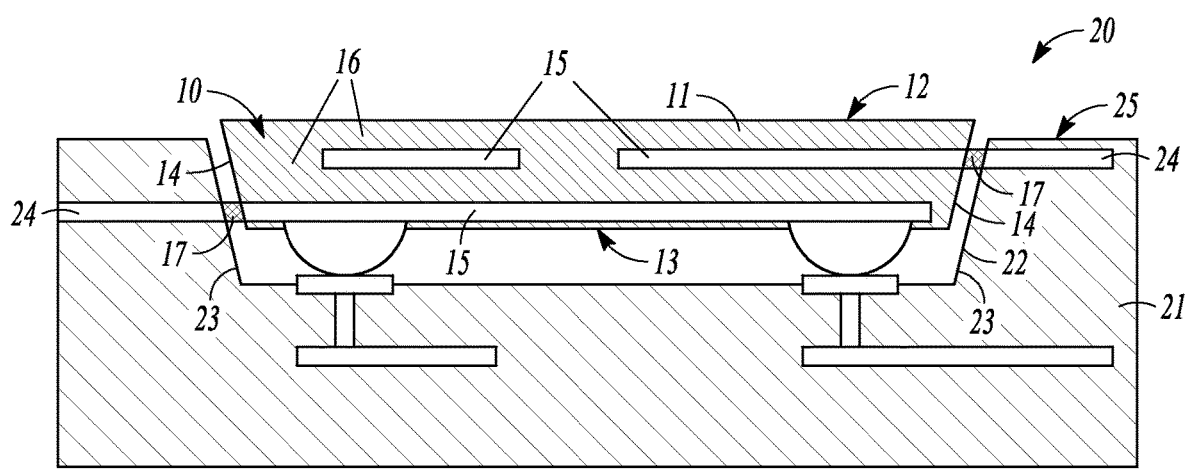
FIG. 4 is a schematic side section view of an example electronic assembly.

FIG. 3 is a perspective view from the bottom of another example interposer 10 when the interposer 10 is mounted to a substrate 21 (e.g., a printed circuit board) to form an electronic assembly 20. FIG. 4 is a schematic side section view of another example form of the electronic assembly 20.

The electronic assembly 20 may include a substrate 21 and an interposer 10 mounted to the substrate 21 such that the substrate 21 may be electrically connected directly to the conductive routings 15 that are exposed on at least one of the side walls 14. The interposer 10 includes a body 11 having upper and lower surfaces 12, 13 and side walls 14 extending between the upper and lower surfaces 12, 13. The interposer 10 further includes conductive routings 15 that are exposed on at least one, some or all of the side walls 14.

In the example electronic assembly 20 shown in FIG. 4, the substrate 21 includes a cavity 22. The interposer 10 is within the cavity 22.

In some forms, the cavity 22 and the substrate 21 may be rectangular. It should be noted that the cavity 22 may have any shape. The shape of the cavity 22 and the substrate 21 will depend in part on the overall configuration of the electronic assembly 10 as well as the number of conductive routings 15 that need to be exposed from the side walls 14 of the interposer 10.

The substrate 21 may include conductive traces 24 that are exposed from side walls 23 of the cavity 22. In some forms, the conductive traces 24 may be larger than the conductive routings 15 in the interposer 10. The conductive traces 24 may be larger than the conductive routings 15 because larger conductive traces 24 may be more easily fabricated in the substrate 21 as opposed to the interposer 10.

The conductive traces 24 that are exposed from the side walls 23 of the cavity 22 may be electrically connected directly to the conductive routings 15 that are exposed from the side walls 14 of the interposer 10. The conductive traces 24 may be electrically connected to the conductive routings 15 in any manner that is known now, or discovered in the future.

In the example electronic assembly 20 shown in FIG. 4, the conductive traces 24 are electrically connected to the conductive routings 15 using solder caps 17. The solder caps 17 may initially be placed on the conductive traces 24 and/or the conductive routings 15. The initial placement of the solder caps 17 on the conductive traces 24 and/or the conductive routings 15 will depend in part on the manufacturing processes that are used to fabricate the conductive traces 24 and the conductive routings 15 (among other factors).

As discussed above relative to the side walls 14 of the body 11, the side walls 23 of the cavity 22 may be at an angle that is the same as the angle of the side walls 14 relative to the upper and lower surfaces 12, 13 of the substrate 11. This angle may be determined in part based on manufacturing considerations that are associated with fabricating the sidewalls 14 of the interposer 10 and the sidewalls 23 of the cavity 22 (among other factors).

Figure 7:
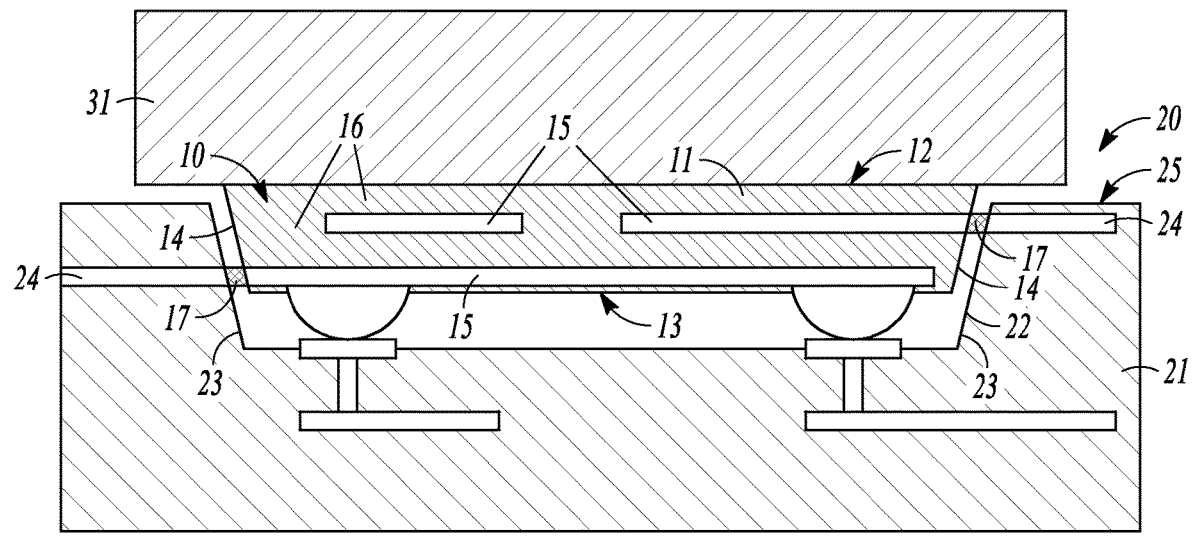
FIG. 7 is a schematic side section view similar to FIGS. 4 and 6 of another example electronic assembly that includes overlapping portions of the electronic assemblies shown in FIGS. 4 and 6.

As shown in FIG. 4, the interposer 10 may be entirely (or partially) below an upper surface 25 of the substrate 21. In some forms, another electronic component 31 may be mounted to the upper surface 12 of the body 11 (see, e.g., FIG. 7). It should be noted that the closer the upper surface 12 of the body 11 is to the bottom of the cavity 22, then the electronic assembly 20 (which includes electronic component 31) will have a desirably smaller Z-height.

In some forms, the interposer 10 may be part of a plurality of interposers that are attached to the substrate 21. The substrate 21 may include a plurality of cavities such that each of the plurality of interposers may be placed within one of the respective cavities in the substrate 21. In other forms, multiple interposers 10 may be placed inside one, some or all of the cavities in the substrate 21.

The size, arrangement and number of (i) cavities in the substrate 21; and (ii) interposers 10 within the respective cavities, will depend in part on the application where the electronic assembly 20 is to be used as well as manufacturing considerations that are associated with fabricating the electronic assembly 20 (among other factors). It should be noted that each of the cavities 22 may be different, partially the same, or entirely the same. In addition, each of the interposers 10 may all be different, partially the same or entirely the same.

In some forms, the conductive traces 24 and/or the conductive traces 15 may be thicker at areas where the conductive routings 15 and conductive traces 24 are exposed from the respective side walls 14, 23. It should be noted that making the conductive routings 15 and the conductive traces 24 that are exposed from their respective side walls 14, 23 thicker (or otherwise larger) may facilitate securing the interposer 10 to the substrate 21 because the exposed thicker areas provide a greater tolerance when aligning the interposer 10 relative to the substrate 21.

In some forms, increasing the thickness of the conductive routings 15 and conductive traces 24 that are exposed from the side walls 14, 23 of the respective interposer 10 and substrate 21 may be realized by performing additional lithography processes similar to those used for redistribution layer processing. It should be noted that any process that is known now, or discovered in the future, may be used to increase the thickness of the conductive routings 15 and conductive traces 24 that exposed from the respective side walls 14, 23.

Figure 5A:
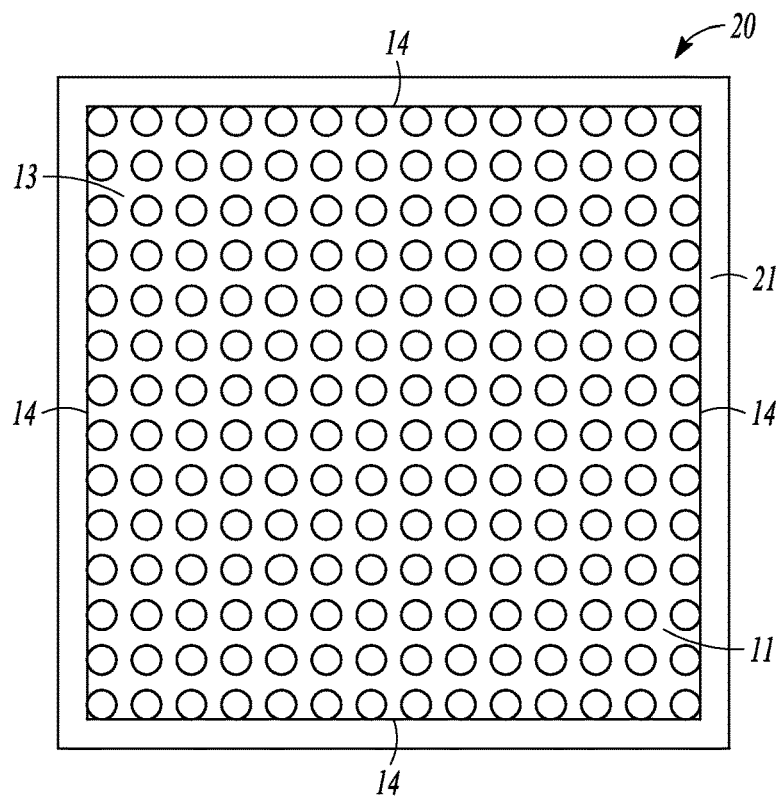
FIGS. 5A-5C are plan views of example interposers.
Figure 5B:
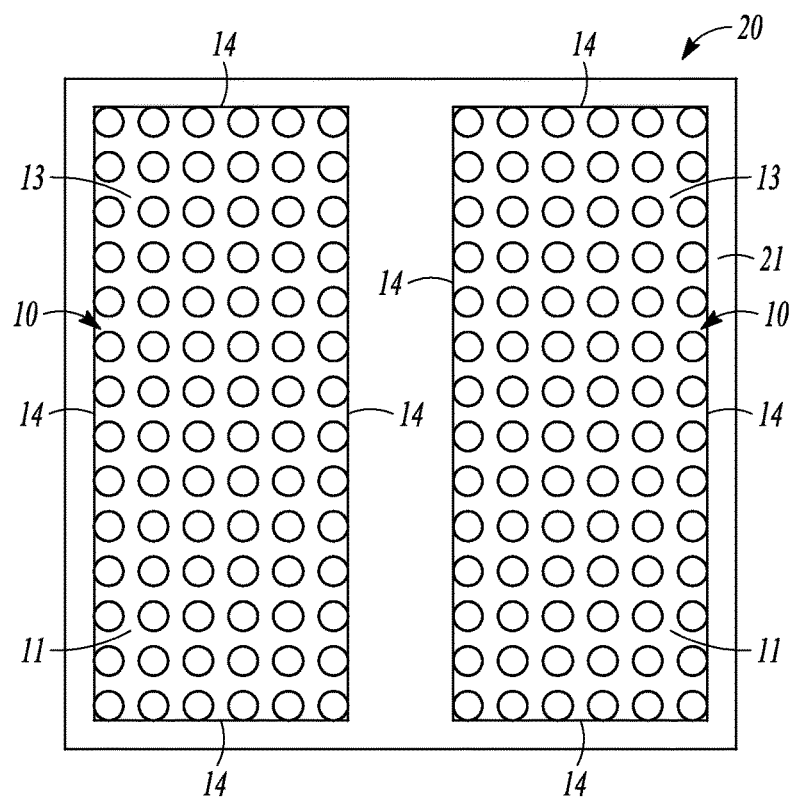
Figure 5C:
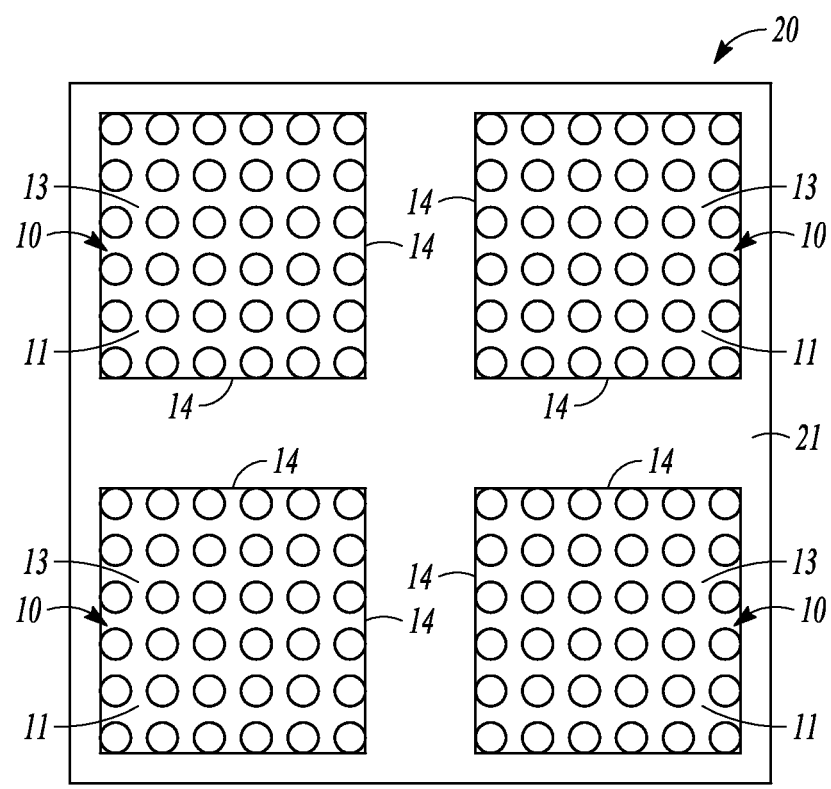

FIGS. 5A-5C are plan views of example electronic assemblies 20. The substrates 21 in each of FIGS. 5A-5C are the same size for the purposes of illustration and description.

In some forms, more than one interposer may be mounted to a substrate 21 in order to increase the overall length of the side walls 14 for the electronic assemblies 20 shown in FIGS. 5A-5C. FIG. 5A shows one interposer 10. FIG. 5B shows two interposers 10. FIG. 5C shows four interposers 10.

As can be seen by comparing FIGS. 5A-5C, the single interposer 10 in FIG. 5A has the least amount of side wall 14 length while the four interposers 10 in FIG. 5C have the highest amount of side wall 14 length. Since the electronic assembly 20 shown in the FIG. 5C has the greatest amount of side wall 14 length, then the electronic assembly 20 shown in FIG. 5C has the capability of incorporating more exposed conductive routings 15 then the electronic assembly 20 shown in FIG. 5A (for a particular substrate 21 size). Alternatively, the electronic assemblies 20 shown in FIGS. 5B and 5C may be made smaller than the electronic assembly 20 shown in FIG. 5A while maintaining the same number of conductive routings 15 that are exposed from the side walls 14 of the interposers 10.

It should be noted that the degree to which the electronic assemblies 20 shown in FIGS. 5B and 5C may be reduced in size will depend in part on the number of layers that are included in the respective interposers 10. As an example, a larger number of layers in each interposer 10 may provide for a reduction in the overall size of the substrate 21 that is used in the electronic assembly 20.

Another potential benefit of incorporating more than one interposer 10 onto a substrate 21 of a given size is that the pitch between the conductive routings 15 that are exposed on the side walls 14 of the respective bodies 11 may be increased. Increasing the pitch of the conductive routings 15 on the side walls 14 may facilitate the manufacturability of the electronic assemblies 20. As an example, increasing the pitch of the conductive routings on the side walls may improve the manufacturing yield by promoting more accurate and reliable connections between the conductive routings 15 that are exposed from the side walls 14 and the conductive traces 24 that are exposed on from the sidewalls 23.

Figure 6:
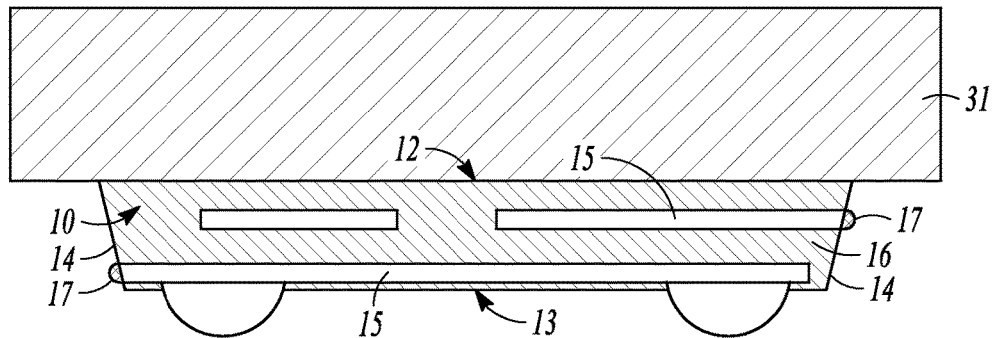
FIG. 6 is a schematic side section view similar to FIG. 4 of another example electronic assembly.

FIG. 6 is a schematic side section view similar to FIG. 4 of another example electronic assembly 20. The example electronic assembly 20 shown in FIG. 6 further includes an electronic component 31 (e.g., a die) that is attached to an interposer 10. The interposer 10 may be similar to any of the interposers described above.

As shown in FIG. 6, the electronic component 31 may be connected directly to the interposer 10. As an example, the electronic component 31 may be electrically connected directly to the upper surface 12 of the interposer 10. In other forms, the electronic component 31 may be electrically connected directly to the lower surface 13 of the interposer 10. The type of electronic component 31 as well as whether the electronic component 31 is electrically connected directly to the upper or lower surfaces 12, 13 of the interposer 10 will depend in part on the (i) the number of electrical interconnects that are required by the electronic component 31; (ii) desired functionality of the electronic assembly 20; and/or (iii) manufacturing processes that are used to fabricate the electronic assembly 20 (among other factors).

As discussed above with regard to FIG. 7, the electronic assembly 20 may further include a substrate 21 that includes a cavity 22 such that the interposer 10 is within the cavity 22. The cavity 22 may include side walls 23 and the substrate 21 may include conductive traces 24 that are exposed from the side walls 23 of the cavity 22. The conductive traces 24 that are exposed from the side walls 23 of the cavity 22 may be electrically connected directly to the conductive routings 15 that are exposed from at least one of the side walls 14 of the interposer 10.

Figure 8:
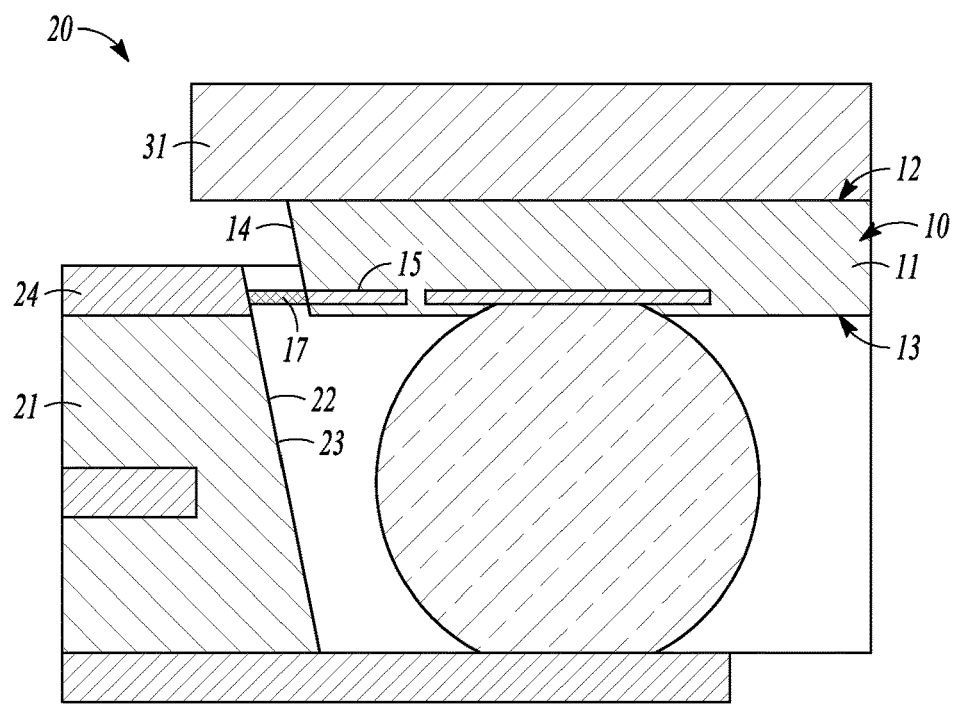
FIG. 8 is an enlarged schematic side section view of an example interposer attached to a substrate.

FIG. 8 is an enlarged schematic side view of an example interposer 10 that is attached to a substrate 21. In the example electronic assembly 20 shown in FIG. 8, the interposer 10 is electrically connected directly to the substrate 21 using a solder ball and a solder cap 17. The solder cap 17 electrically connects the conductive routing 15 that is exposed from the side wall 14 of the body 11 with a conductive trace 24 that is exposed from the side wall 23 of the cavity 22.

Figure 9:
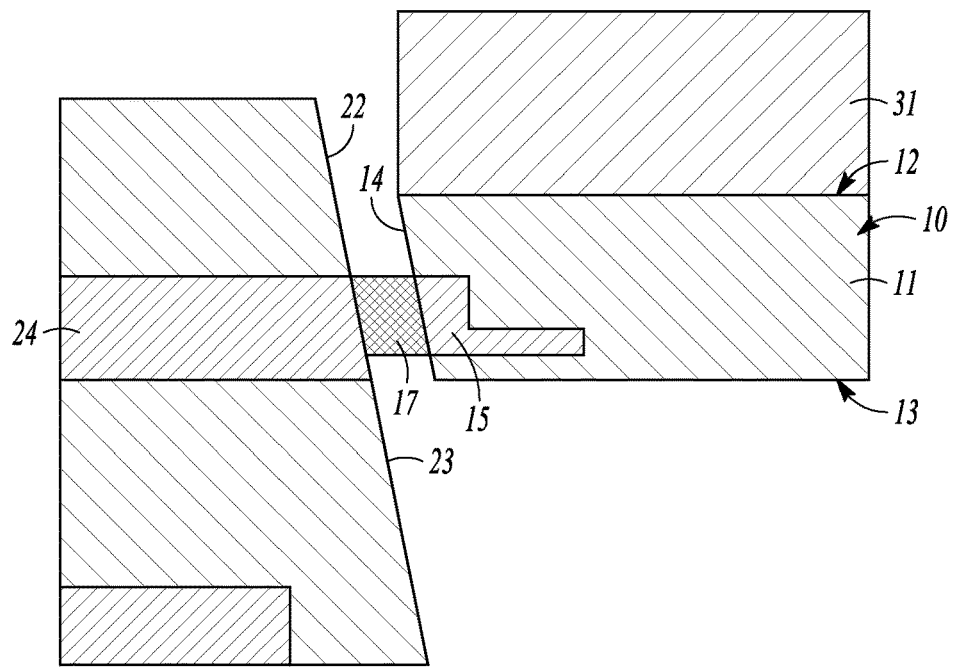
FIG. 9 is an enlarged schematic side section view similar to FIG. 8 illustrating another example interposer attached to a substrate.

FIG. 9 is an enlarged schematic side section view similar to FIG. 8 illustrating another example interposer 10 attached to a substrate 21. In the example electronic assembly 20 shown in FIG. 9, the interposer 10 is electrically connected directly to the substrate 21 using a solder cap 17. As compared to FIG. 8, the conductive routing 15 that is exposed from the side wall 14 of the interposer 10 and the conductive trace 24 that is exposed from the side wall 23 of the cavity 22 are both made thicker. Making the conductive routings 15 and the conductive traces 24 thicker may facilitate fabrication of the electronic assembly 20 by increasing the tolerance associated with aligning the interposer 10 relative to the cavity 22 in the substrate 21.

Figure 10:
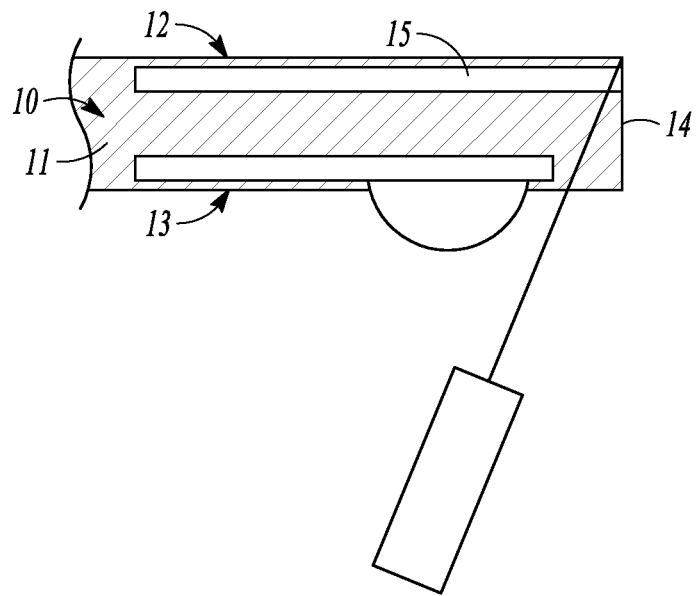
FIGS. 10-12 are schematic side section views illustrating an example process for fabricating an electronic assembly.
Figure 11:
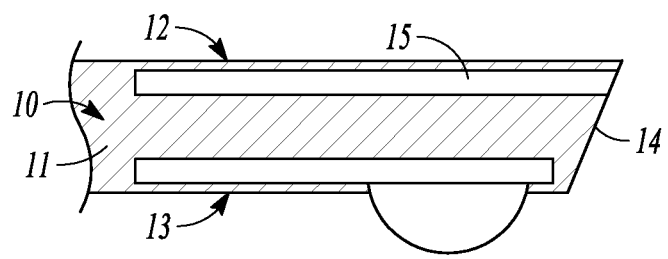
Figure 12:
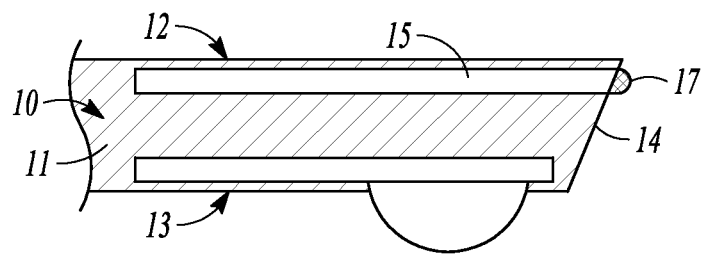

FIGS. 10-12 are schematic side views illustrating an example process for fabricating an electronic assembly 20. As shown in FIG. 10, the side walls 14 of the interposer 10 may be laser ablated in order to form the side walls 14 at an angle relative to the upper and lower surfaces 12, 13 of the body 11. It should be noted that other processes besides laser ablation that are known now, or discovered in the future, may be used to form the side walls 14 at an angle relative to the upper and lower surfaces 12, 13 of the body 11.

FIG. 11 shows the interposer 10 after the side wall 14 has been formed at an angle relative to the upper and lower surface 12, 13 of the body 11. FIG. 12 shows the interposer 10 after a solder cap 17 has been formed on a conductive routing 15 which is exposed from the side wall 14 of the body 11.

Figure 13:
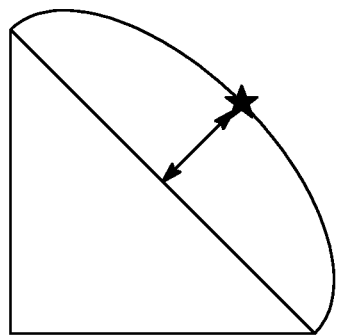
FIG. 13 is a drawing that identifies solder cushion thicknesses which is calculated by letting a defined solder volume reflow freely on an exposed trace area.
Figure 14:
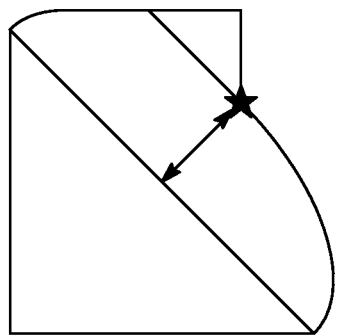
FIG. 14 is a drawing that identifies the pad-to-pad distance when the package pad touches the solder cushion and gets completely wetted.
Figure 15:
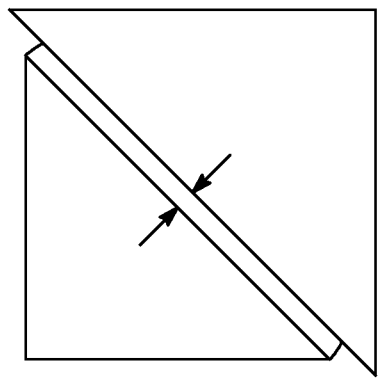
FIG. 15 is a drawing that identifies the minimum pad-to-pad distance before solder is spilled beyond a pad area for a fixed solder volume.
Figure 16:
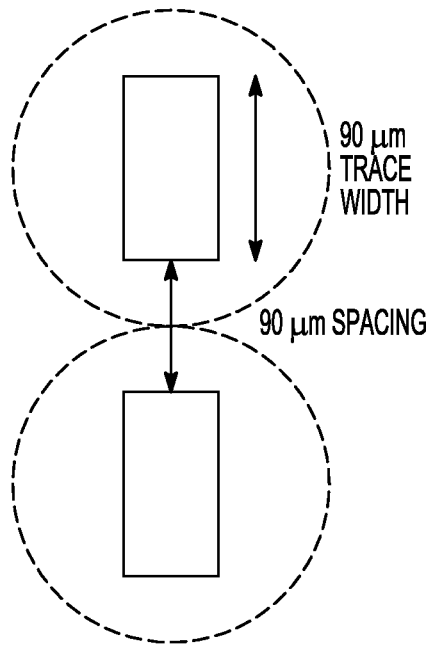
FIG. 16 is a drawing that illustrates a shorting condition between two adjacent squeezed out solder cushions.

FIG. 13 is a drawing that identifies solder cushion thicknesses which is calculated by letting a defined solder volume reflow freely on an exposed trace area. FIG. 14 is a drawing that identifies the pad-to-pad distance when the package pad touches the solder cushion and gets completely wetted. FIG. 15 is a drawing that identifies the minimum pad-to-pad distance before solder is spilled beyond a pad area for a fixed solder volume. FIG. 16 is a drawing that illustrates a shorting condition between two adjacent squeezed out solder cushions.

Figures 17, 18:
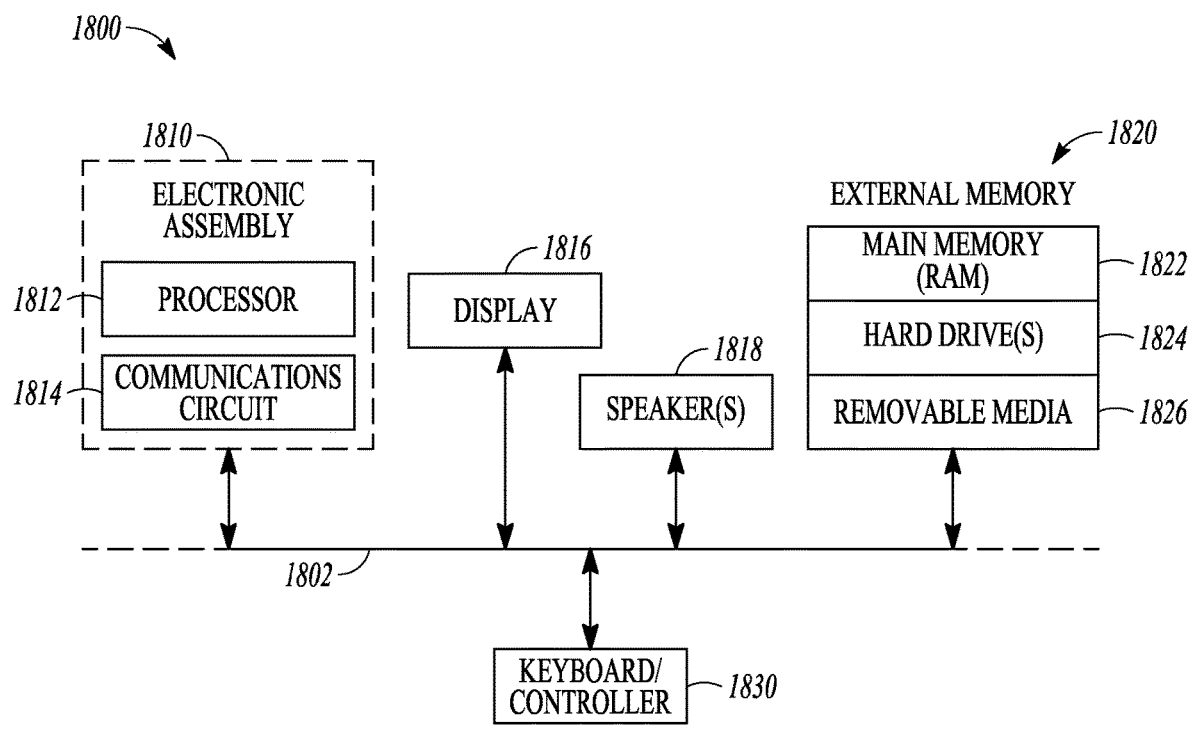
FIG. 17 shows a table that provides the distances between the sidewalls of the interposer and the cavity in the substrate under various conditions.
FIG. 18 is block diagram of an electronic apparatus that includes the electrical interconnects and/or electronic packages described herein.

FIG. 17 shows a table that provides the distances between the sidewalls of the interposer and the cavity in the substrate under various conditions. As an example, the table shown in FIG. 17 provides solder cushion thicknesses for different solder volumes after reflow. As another example, the table shown in FIG. 17 provides the pad-to-pad distances at various stages of the solder joining process.

As another example, the table shown in FIG. 17 provides the minimum pad-to-pad distance before solder is spilled beyond the pad area for a fixed solder volume. The solder may undesirably spill beyond the pad area as the interposer is pushed into the cavity by force and the pad-to-pad distance gets smaller than the distance for free wetting.

As another example, the table shown in FIG. 17 provides the minimal distance between the sidewall of the interposer and the sidewall of the cavity in the substrate in order to avoid a shorting condition between two adjacent pads. As another example, the table shown in FIG. 17 provides the maximum distance between the sidewall of the interposer and the sidewall of the cavity in the substrate in order to ensure proper wetting.

The interposers and electronic assemblies described herein may provide an overall higher I/O count for electronic assemblies without increasing the overall footprint of such electronic assemblies. In addition, the electronic assemblies may include a reduced z-height such that the electronic assemblies may be more readily incorporated into small-scale electronic devices that include the electronic assemblies.

FIG. 18 is a block diagram of an electronic apparatus 1800 incorporating at least one interposer and/or electronic assembly described herein. Electronic apparatus 1800 is merely one example of an electronic apparatus in which forms of the interposers and/or electronic assemblies described herein may be used.

Examples of an electronic apparatus 1800 include, but are not limited to, personal computers, tablet computers, mobile telephones, wearables, game devices, MP3 or other digital music players, etc. In this example, electronic apparatus 1800 comprises a data processing system that includes a system bus 1802 to couple the various components of the electronic apparatus 1800. System bus 1802 provides communications links among the various components of the electronic apparatus 1800 and may be implemented as a single bus, as a combination of busses, or in any other suitable manner.

An electronic assembly 1810 that includes any of the electronic interposers and/or electronic assemblies described herein may be coupled to system bus 1802. The electronic assembly 1810 may include any circuit or combination of circuits. In one embodiment, the electronic assembly 1810 includes a processor 1812 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 1810 are a custom circuit, an application-specific integrated circuit (ASIC), or the like, such as, for example, one or more circuits (such as a communications circuit 1814) for use in wireless devices like mobile telephones, tablet computers, laptop computers, two-way radios, and similar electronic systems. The IC can perform any other type of function.

The electronic apparatus 1800 may also include an external memory 1820, which in turn may include one or more memory elements suitable to the particular application, such as a main memory 1822 in the form of random access memory (RAM), one or more hard drives 1824, and/or one or more drives that handle removable media 1826 such as compact disks (CD), flash memory cards, digital video disk (DVD), and the like.

The electronic apparatus 1800 may also include a display device 1816, one or more speakers 1818, and a keyboard and/or controller 1830, which can include a mouse, trackball, touch screen, voice-recognition device, or any other device that permits a system user to input information into and receive information from the electronic apparatus 1800.

To better illustrate the interposers and/or the electronic assemblies disclosed herein, a non-limiting list of embodiments is provided herein:

Example 1 includes an interposer. The interposer includes a body that includes upper and lower surfaces and side walls extending between the upper and lower surfaces; and conductive routings that are exposed on at least one of the side walls.

Example 2 includes the interposer of example 1, wherein the conductive routings are exposed on each of the side walls.

Example 3 includes the interposer of any one of examples 1-2, wherein the conductive routings are exposed on the upper and lower surfaces.

Example 4 includes the interposer of any one of examples 1-3, wherein the interposer includes multiple nonconductive layers, wherein the conductive routings extend between the multiple nonconductive layers.

Example 5 includes the interposer of any one of examples 1-4, wherein the nonconductive layers are dielectric layers.

Example 6 includes the interposer of any one of examples 1-5, wherein at least some of the conductive routings that are exposed from the side walls are between different nonconductive layers and are laterally displaced relative to one another.

Example 7 includes the interposer of any one of examples 1-6, wherein at least some of the conductive routings that are exposed from the side walls are exposed between non-adjacent nonconductive layers.

Example 8 includes the interposer of any one of examples 1-7, wherein at least one of the side walls is at an angle other than 90 degrees relative to the upper surface and the lower surface of the body Example 9 includes the interposer of any one of examples 1-8, wherein each of the side walls is at an angle other than 90 degrees relative to the upper surface and the lower surface of the body.

Example 10 includes the interposer of any one of examples 1-9, and further including solder caps that are mounted on the conductive routings which are exposed from the side walls of the body.

Example 11 includes an electronic assembly. The electronic assembly includes a substrate; and an interposer that includes a body having upper and lower surfaces and side walls extending between the upper and lower surfaces, the interposer further including conductive routings that are exposed on at least one of the side walls, wherein the substrate is electrically connected directly to the conductive routings that are exposed on at least one of the side walls.

Example 12 includes the electronic assembly of example 11, wherein the conductive routings are exposed on each side wall and on the upper and lower surfaces.

Example 13 includes the electronic assembly of any one of examples 11-12, wherein the substrate includes a cavity, and the interposer is within the cavity.

Example 14 includes the electronic assembly of any one of examples 11-13, wherein the interposer is secured to a bottom of the cavity with solder balls.

Example 15 includes the electronic assembly of any one of examples 11-14, wherein the cavity includes sidewalls and substrate includes conductive traces that are exposed from the sidewalls of the cavity, wherein the conductive traces that are exposed from the sidewalls of the cavity are electrically connected directly to the conductive routings that are exposed on at least one of the side walls of the interposer.

Example 16 includes the electronic assembly of any one of examples 11-15, wherein each of the side walls of the interposer is at a first angle other than 90 degrees relative to the upper surface and the lower surface of the body, wherein each of the side walls of the cavity is at a second angle that is the same as the first angle relative to an upper and lower surface of the substrate.

Example 17 includes the electronic assembly of any one of examples 11-16, and further including solder caps that are mounted on the conductive routings that are exposed from the side walls of the body and mounted on the conductive traces that are exposed from the side walls of the cavity.

Example 18 includes the electronic assembly of any one of examples 11-17, wherein the interposer is below an upper surface of the substrate.

Example 19 includes the electronic assembly of any one of examples 11-18, wherein at least one of the sidewalls of the interposer is secured to at least one of the sidewalls of the cavity with solder caps.

Example 20 includes the electronic assembly of any one of examples 11-19, wherein the conductive traces are thicker at areas where the conductive traces are exposed from the sidewalls of the cavity.

Example 21 includes an electronic assembly. The electronic assembly includes an electronic component; and an interposer that includes a body having upper and lower surfaces and side walls extending between the upper and lower surfaces, the interposer further including conductive routings that are exposed on at least one of the side walls, wherein the electronic component is connected directly to the interposer.

Example 22 includes the electronic assembly of example 21, wherein the conductive routings are exposed on each side wall and on the upper and lower surfaces.

Example 23 includes the electronic assembly of any one of examples 21-22, wherein the electronic component is electrically connected directly to the upper surface of the interposer.

Example 24 includes the electronic assembly of any one of examples 21-23, and further including a substrate that includes a cavity such that the interposer is within the cavity, wherein the cavity includes sidewalls and substrate includes conductive traces that are exposed from the sidewalls of the cavity, wherein the conductive traces that are exposed from the sidewalls of the cavity are electrically connected directly to the conductive routings that are exposed on at least one of the side walls of the interposer.

Example 25 includes the electronic assembly of any one of examples 21-24, wherein each of the side walls of the interposer is at an angle relative to the upper surface and the lower surface of the body, wherein each of the side walls of the cavity is at an angle relative to an upper and lower surface of the substrate.

Example 26 includes the electronic assembly of any one of examples 21-25, wherein the electronic component is a die.

Example 27 includes a method of fabricating an interposer. The method includes removing a portion of an interposer such that conductive routings are exposed from the side walls of the interposer between nonconductive layers of the interposer.

Example 28 includes the method of example 27, wherein removing a portion of the interposer includes forming the sidewalls such that at least one of the side walls is at an angle other than 90 degrees relative to an upper surface and a lower surface of the interposer.

Example 29 includes the method of any one of examples 27-28, wherein removing a portion of the interposer includes forming the sidewalls such that each of the side walls is at an angle other than 90 degrees relative to an upper surface and a lower surface of the interposer.

Example 30 includes the method of any one of examples 27-29, wherein removing a portion of the interposer includes laser ablating the interposer.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. In addition, the order of the methods described herein may be in any order that permits fabrication of an electrical interconnect and/or package that includes an electrical interconnect. Other embodiments can be used, such as by one of ordinary skill in the art upon reviewing the above description.

The Abstract is provided to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic assembly, comprising:
   a substrate; and
   an interposer that includes a body having upper and lower surfaces and side walls extending between the upper and lower surfaces, the interposer further including conductive routings that are exposed on at least one of the side walls, wherein the substrate is electrically connected directly to the conductive routings that are exposed on at least one of the side walls, wherein the conductive routings are exposed from the body on each side wall of the interposer and on the upper and lower surfaces of the interposer, wherein the substrate includes a cavity, and the interposer is within the cavity, wherein the interposer is secured to a bottom of the cavity with solder balls, wherein the cavity includes sidewalls and the substrate includes conductive traces that are exposed from the sidewalls of the cavity, wherein the conductive traces that are exposed from the sidewalls of the cavity are electrically connected directly to the conductive routings that are exposed on at least one of the side walls of the interposer, wherein each of the side walls of the interposer is at a first angle other than 90 degrees relative to the upper surface and the lower surface of the body, wherein each of the side walls of the cavity is at a second angle that is the same as the first angle relative to an upper and lower surface of the substrate; and
   a plurality of solder caps that physically connect at least some of the conductive traces in the substrate to at least some of the conductive routings on the interposer.

2. The electronic assembly of claim 1, wherein the interposer is below an upper surface of the substrate.

3. The electronic assembly of claim 1, wherein at least one of the sidewalls of the interposer is secured to at least one of the sidewalls of the cavity with solder caps.

4. The electronic assembly of claim 1, wherein the conductive traces are thicker at areas where the conductive traces are exposed from the sidewalls of the cavity.

5. An electronic assembly, comprising:
   a die; and
   an interposer that includes a body having upper and lower surfaces and side walls extending between the upper and lower surfaces, the interposer further including conductive routings that are exposed on at least one of the side walls, wherein the die is connected directly to the upper surface of the interposer, wherein the conductive routings are exposed from the body on each side wall of the interposer and on the upper and lower surfaces of the interposer, wherein the electronic component is electrically connected directly to the upper surface of the interposer;
   a substrate that includes a cavity such that the interposer is within the cavity, wherein the cavity includes sidewalls and the substrate includes conductive traces that are exposed from the sidewalls of the cavity, wherein the conductive traces that are exposed from the sidewalls of the cavity are electrically connected directly to the conductive routings that are exposed on at least one of the side walls of the interposer; and
   a plurality of solder caps that physically connect at least some of the conductive traces in the substrate to at least some of the conductive routings on the interposer.

6. The electronic assembly of claim 5, wherein each of the side walls of the interposer is at an angle other than 90 degrees relative to the upper surface and the lower surface of the body, wherein each of the side walls of the cavity is at an angle other than 90 degrees relative to an upper and lower surface of the substrate.

7. An electronic assembly, comprising:
   a die;
   an interposer that includes a body having upper and lower surfaces and side walls extending between the upper and lower surfaces, the interposer further including conductive routings that are exposed on at least one of the side walls, wherein the die is connected directly to the upper surface of the interposer, wherein the conductive routings are exposed from the body on each side wall of the interposer and on the upper and lower surfaces of the interposer, wherein the electronic component is electrically connected directly to the upper surface of the interposer;
   a substrate that includes a cavity such that the interposer is within the cavity, wherein the cavity includes sidewalls and the substrate includes conductive traces that are exposed from the sidewalls of the cavity, wherein the conductive traces that are exposed from the sidewalls of the cavity are electrically connected directly to the conductive routings that are exposed on at least one of the side walls of the interposer, wherein the die is entirely above the uppermost surface of interposer.

8. The electronic assembly of claim 7, further comprising solder caps that are mounted on the conductive routings that are exposed from the side walls of the body and mounted on the conductive traces that are exposed from the side walls of the cavity.

9. The electronic assembly of claim 7, wherein the interposer is below an upper surface of the substrate.

10. The electronic assembly of claim 7, wherein at least one of the sidewalls of the interposer is secured to at least one of the sidewalls of the cavity with solder caps.

11. The electronic assembly of claim 7, wherein the conductive traces are thicker at areas where the conductive traces are exposed from the sidewalls of the cavity.

* * * * *